United States Patent
Parsa et al.

(10) Patent No.: US 11,848,680 B1
(45) Date of Patent: Dec. 19, 2023

(54) UNLIMITED BANDWIDTH SHIFTING SYSTEMS AND METHODS OF AN ALL-DIGITAL PHASE LOCKED LOOP

(71) Applicant: Apple Inc., Cupertino, CA (US)

(72) Inventors: Ali Parsa, Poway, CA (US); Ahmed I Hussein, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/746,729

(22) Filed: May 17, 2022

(51) Int. Cl.
*H03L 7/10* (2006.01)
*H03K 3/037* (2006.01)
*H03L 7/093* (2006.01)

(52) U.S. Cl.
CPC .............. *H03L 7/10* (2013.01); *H03K 3/037* (2013.01); *H03L 7/093* (2013.01)

(58) Field of Classification Search
CPC ............................... H03L 7/085; H03L 7/093
See application file for complete search history.

(56) References Cited

U.S. PATENT DOCUMENTS

| | | | |
|---|---|---|---|
| 7,498,890 B2 | 3/2009 | Wallberg et al. | |
| 8,126,401 B2 | 2/2012 | Staszewski et al. | |
| 8,306,176 B2 | 11/2012 | Staszewski et al. | |
| 8,429,487 B2 | 4/2013 | Chang et al. | |
| 9,385,731 B2 | 7/2016 | Kuo et al. | |
| 10,367,464 B2 * | 7/2019 | Salle ..................... | H03C 3/0908 |
| 10,715,157 B2 | 7/2020 | Can et al. | |
| 10,938,396 B2 | 3/2021 | Agrawal et al. | |
| 11,005,481 B2 | 5/2021 | Shumaker et al. | |

OTHER PUBLICATIONS

Staszewski et al., "All-Digital PLL With Ultra Fast Settling", IEEE Transactions on Circuits and Systems—II: Express Briefs, vol. 54, No. 2, Feb. 2, 2007.
O'Reilly Media, Inc., "Closed-Loop Frequency Bandwidth and Cutoff Frequency," Modern Control System Theory and Design, 2nd Edition, https://www.oreilly.com/library/view/modern-control-system/9780471249061/sec6-13.html, accessed May 12, 2022.

\* cited by examiner

*Primary Examiner* — Diana J. Cheng
(74) *Attorney, Agent, or Firm* — FLETCHER YODER PC

(57) ABSTRACT

This disclosure is directed towards systems and methods that improve bandwidth shifting operations of an ADPLL without losing a lock of the ADPLL and having the benefit of being able to change the bandwidth an unlimited amount of times. Indeed, a processor may transmit amplification parameters to the ADPLL to implement a bandwidth shift. The shift may occur in response to a enable signal, such as a gear trigger control signal (gear_retime signal) or a enable signal generated to cause alignment of the shifting with a clock signal (e.g., enable signal generated by AND logic gates). These systems and methods described herein many enable multiple bandwidth changing operations to occur without compromising the complexity and footprint of the system.

20 Claims, 16 Drawing Sheets

US 11,848,680 B1

UNLIMITED BANDWIDTH SHIFTING SYSTEMS AND METHODS OF AN ALL-DIGITAL PHASE LOCKED LOOP

BACKGROUND

The present disclosure relates generally to wireless communication, and more specifically to all-digital phase lock loop circuitry in transmitters and/or receivers in wireless communication devices.

In an electronic device, a transmitter and a receiver may each be coupled to one or more antennas to enable the electronic device to both transmit and receive wireless signals. The transmitter, the receiver, or both may include an all-digital phase locked loop circuitry (ADPLL) that aids in changing a loop bandwidth used in communications. The ADPLL may use a fully digital loop filter to filter desired signals in a channel bandwidth having the loop bandwidth from unwanted signals outside the channel bandwidth, which may provide an ability to change the loop bandwidth more quickly and efficiently than analog counterparts. This creates an opportunity for a much faster locking PLL (e.g., compared to an analog PLL) by increasing the loop bandwidth at the start of a lock and then tightening (e.g., reducing) the loop bandwidth once locked (e.g., to that of the channel bandwidth) to reduce phase noise signals outside of the channel bandwidth. Ideally, switching a loop bandwidth should not disturb a loop operation to lock a channel (e.g., as performed by the ADPLL), otherwise the whole premise of changing a loop gain or "gear shifting" to lock the channel becomes moot. However, often switching a loop bandwidth does disturb the lock and thus may affect ongoing communications.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a circuit may include processing circuitry and an all-digital phase locked loop with a digital loop filter. The processing circuitry may generate a first amplification parameter and a second amplification parameter. The digital loop filter may include a first set of flip-flops that loads the first amplification parameter at a first time and a first path that includes a first digital multiplier which receives the first amplification parameter from the first set of flip-flops. The digital loop filter may also include a second set of flip-flops that loads the second amplification parameter at a second time, where the second set of flip-flops may write the second amplification parameter over a previously stored indication of the first amplification parameter. The digital loop filter may also include a second path with a second digital multiplier that receives the second amplification parameter from the second set of flip-flops.

In another embodiment, a transceiver may include processing circuitry and a digital loop filter. The processing circuitry may generate a first amplification parameter and a second amplification parameter. The digital loop filter may amplify a first input signal based on the first amplification parameter, write over the first amplification parameter with the second amplification parameter, and amplify second input signal based on the second amplification parameter.

In yet another embodiment, a method may include sending, via processing circuitry, a first amplification parameter to a digital loop filter of an all-digital phase locked loop (ADPLL) and sending, via the processing circuitry, a first enable signal to the digital loop filter. The first enable signal may cause a first flip-flop to store the first amplification parameter. The method may include determining, via the processing circuitry, to shift a bandwidth of the digital loop filter using a second amplification parameter. The method may also include sending, via the processing circuitry, the second amplification parameter to the digital loop filter to cause a second flip-flop to store the first amplification parameter and receiving, at the processing circuitry, an indication that the ADPLL is locked to a reference signal after sending the second amplification parameter.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
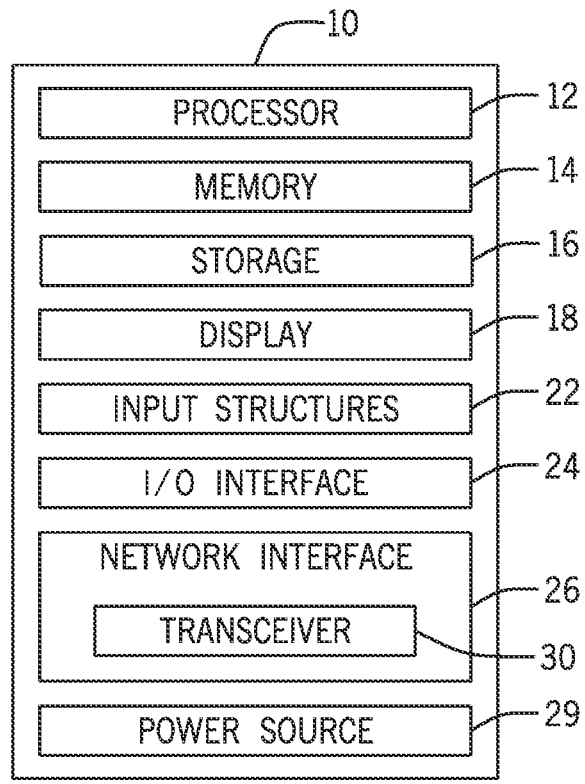
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

This disclosure is directed to systems and methods that implement a compact design and implementation of a fully digital loop filter with the ability to have unlimited loop gain change or gear shifting without a requirement for huge memory. When using a radio frequency communication device, transmitter and/or receiver circuitry may include local oscillator circuitry that uses an all-digital phase locked loop (ADPLL) and a time-to-digital converter (TDC) in place of some components, like a phase/frequency detector, a charge pump, and a loop filter. During operation, there may be two stages to ADPLL operation—before the ADPLL locks (e.g., at a desired loop or filter bandwidth) and after the ADPLL locks. Before locking, the ADPLL may use a larger loop bandwidth than after the locking. Increasing the loop bandwidth may enable faster settling during locking and, once settled (e.g., locked), reducing the loop bandwidth may assist with noise suppression. Changing the bandwidth once the ADPLL is settled may cause the ADPLL to be disturbed, losing its lock. Although changing the bandwidth affects both a proportional path (Kp) and an integrator path (Ki) in the ADPLL, disturbances to the integrator path settle with more ease based on its feedback path. By including circuitry in the proportional path to similarly base a new output on a previous output, disturbances introduced to the proportional path may similarly settle with more ease.

Embodiments herein provide various apparatuses and techniques to reduce or eliminate a likelihood of an ADPLL losing its lock when changing between bandwidths (e.g., of different channels). To do so, the embodiments disclosed herein include a digital loop filter that may have flip-flops to store an output value from the digital loop filter. Storing the output value may help ensure continuity between amplification changes, thereby preventing bandwidth switching from causing the ADPLL to lose its lock. The apparatuses and techniques described herein may also have the added benefit of performing any number of loop gain changes or gear shifting operations (as opposed to being locked into one loop gain). Furthermore, by using a digital loop filter that is able to have old loop gain values overwritten when changing the loop gain, a footprint of the digital loop filter may be relatively small compared to other loop gain changing solutions. Indeed, values stored for changing the bandwidth may sometimes be implemented using a new value and a previous value, as well as a feedback output, which enables continuity between the bandwidth changes and reduces a likelihood of the ADPLL losing its lock as a result of the bandwidth change.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FTC)), and/or a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a 6th generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX☐), mobile broadband Wireless networks (mobile WIMAX☐), asynchronous digital subscriber lines (e.g., ADSL, VDSL), digital video broadcasting-terrestrial (DVB-T☐) network and its extension DVB Handheld (DVB-H☐) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
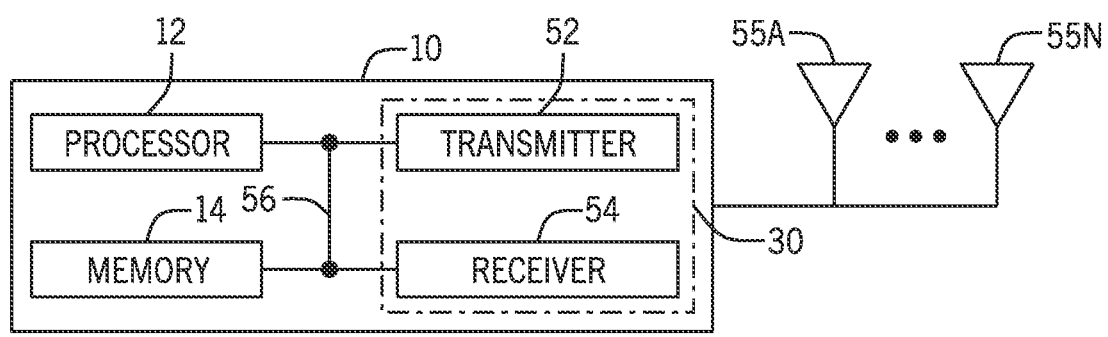
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
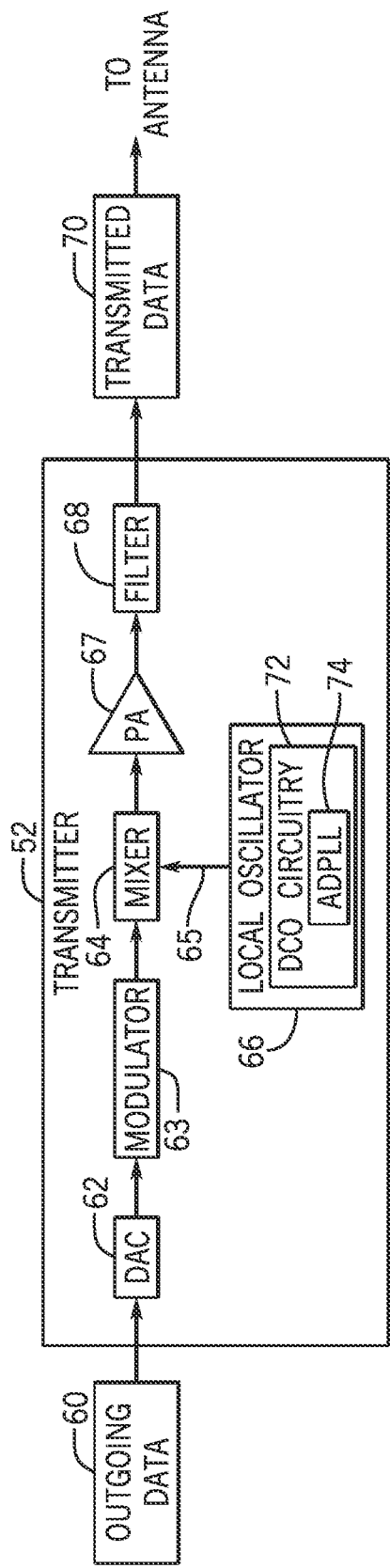
FIG. 3 is a schematic diagram of a transmitter of the electronic device of FIG. 1, according to embodiments of the present disclosure.

As mentioned above, the transceiver 30 of the electronic device 10 may include a transmitter and a receiver that are coupled to at least one antenna to enable the electronic device 10 to transmit and receive wireless signals. FIG. 3 is a block diagram of a transmitter 52 (e.g., transmit circuitry) that may be part of the transceiver 30, according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 63 may combine the converted analog signal with a carrier signal. A mixer 64 may combine the carrier signal with a local oscillator signal 65 from a local oscillator 66 to generate a radio frequency signal. In particular, the local oscillator 66 may include digital-controlled oscillation (DCO) circuitry 72 that generates or facilitates generating the local oscillation signal 65, which may operate based on signals generated by all-digital phase locked loop circuitry 74. The all-digital phase locked loop circuitry 74 may generate one or more clocks used by at least the DCO circuitry 72 and/or may verify timing of one or more signals used by at least the DCO circuitry 72 are accurate relative to a system clock.

A power amplifier (PA) 67 receives the radio frequency signal from the mixer 64, and may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted data 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing data 60 via the one or more antennas 55. For example, the transmitter 52 may include an additional mixer and/or a digital up converter (e.g., for converting an input signal from a baseband frequency to an intermediate frequency). As another example, the transmitter 52 may not include the filter 68 if the power amplifier 67 outputs the amplified signal in or approximately in a desired frequency range (such that filtering of the amplified signal may be unnecessary).

Figure 4:
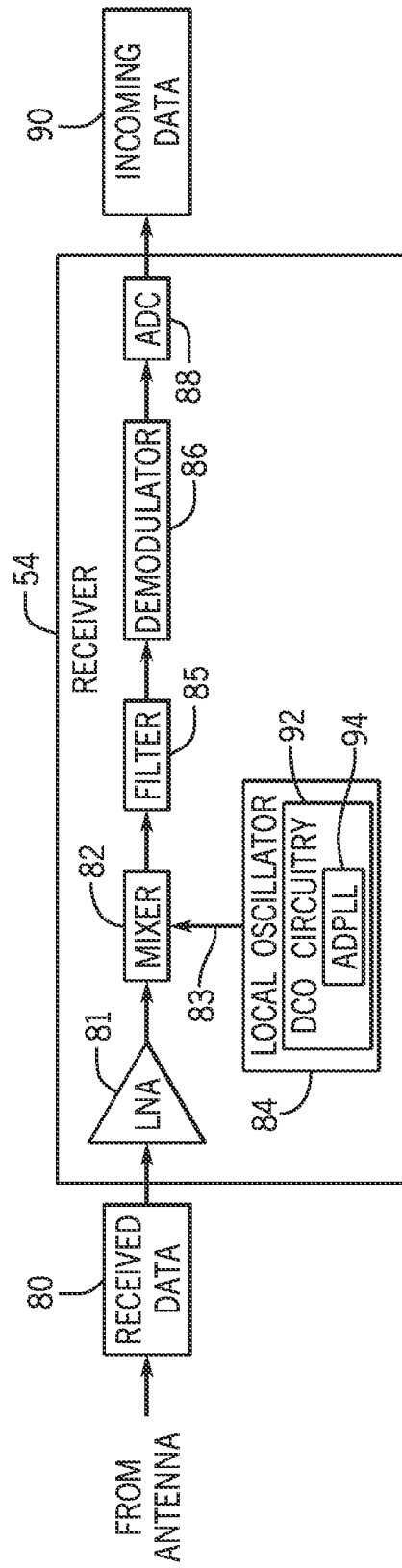
FIG. 4 is a schematic diagram of a receiver of the electronic device of FIG. 1, according to embodiments of the present disclosure.

FIG. 4 is a schematic diagram of a receiver 54 (e.g., receive circuitry) that may be part of the transceiver 30, according to embodiments of the present disclosure. As illustrated, the receiver 54 may receive received data 80 from the one or more antennas 55 in the form of an analog signal. A low noise amplifier (LNA) 81 may amplify the received analog signal to a suitable level for the receiver 54 to process. A mixer 82 may combine the amplified signal with a local oscillation signal 83 from a local oscillator 84 to generate an intermediate or baseband frequency signal. Like the local oscillator 66 of the transmitter 52, the local oscillator 84 of the receiver 54 may include may include digital-controlled oscillation (DCO) circuitry 92 that generates or facilitates generating the local oscillation signal 83, which may operate based on signals generated by all-digital phase locked loop circuitry 94. The all-digital phase locked loop circuitry 94 may generate one or more clocks used by at least the DCO circuitry 92 and/or may verify timing of one or more signals used by at least the DCO circuitry 92 are accurate relative to a system clock.

A filter 85 (e.g., filter circuitry and/or software) may remove undesired noise from the signal, such as cross-channel interference. The filter 85 may also remove additional signals received by the one or more antennas 55 that are at frequencies other than the desired signal. The filter 85 may include any suitable filter or filters to remove the undesired noise or signals from the received signal, such as a bandpass filter, a bandstop filter, a low pass filter, a high pass filter, and/or a decimation filter. A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include an additional mixer and/or a digital down converter (e.g., for converting an input signal from an intermediate frequency to a baseband frequency).

Figure 5:
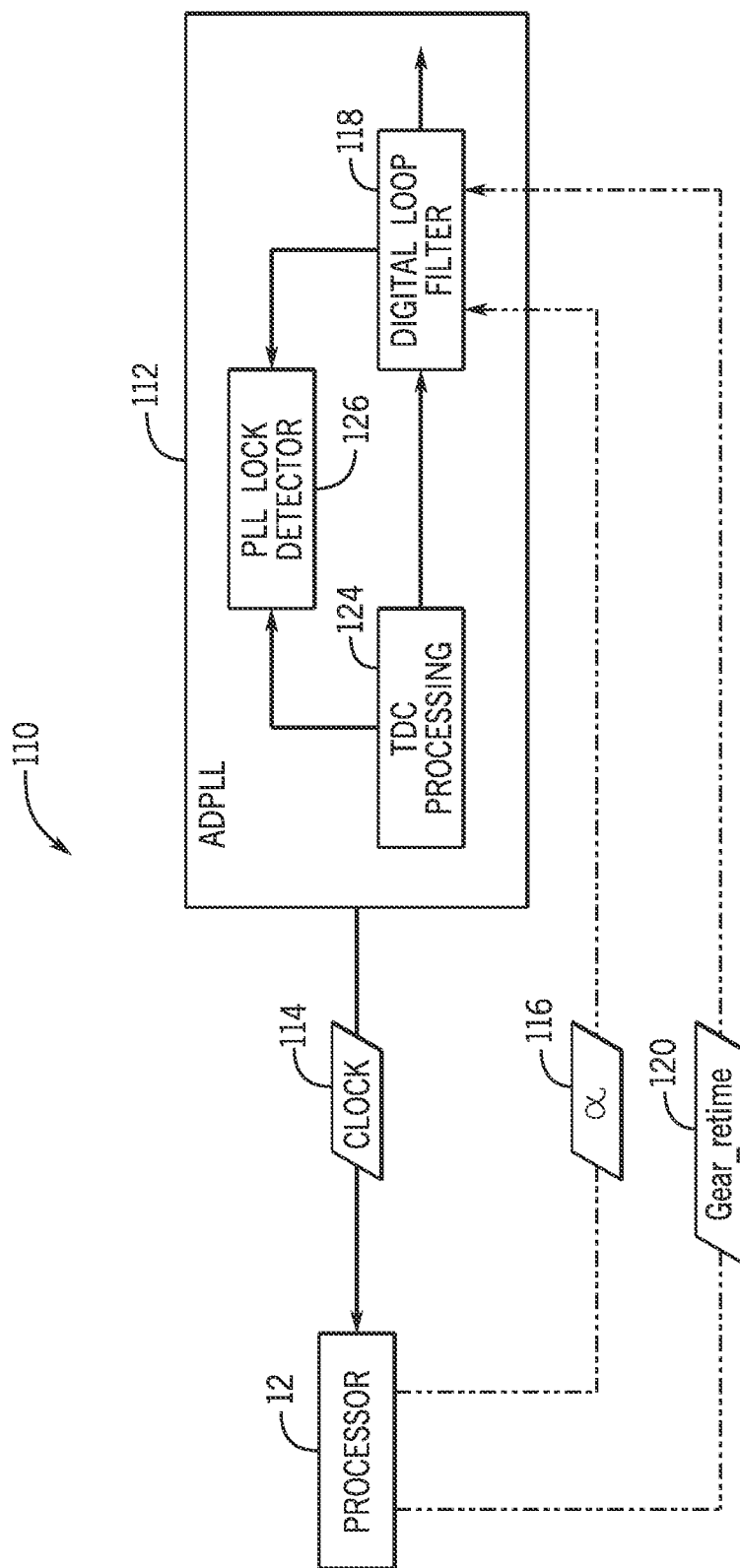
FIG. 5 is a schematic diagram of a portion of local oscillator circuitry of FIGS. 3-4 that includes a digital loop filter, according to embodiments of the present disclosure.

FIG. 5 is a schematic diagram of at least a portion of the DCO circuitry 92, the DCO circuitry 72, or both, according to embodiments of the present disclosure. For ease of description, DCO circuitry 110 illustrated and components therein are labeled with new reference numerals relative to FIGS. 3-4, but it should be understood that when implemented in the DCO circuitry 72 (of FIG. 3), the DCO circuitry 100 may include the ADPLL 74 and when implemented in the DCO circuitry 92 (of FIG. 4), the DCO circuitry 100 may include the ADPLL 94.

Figure 15:
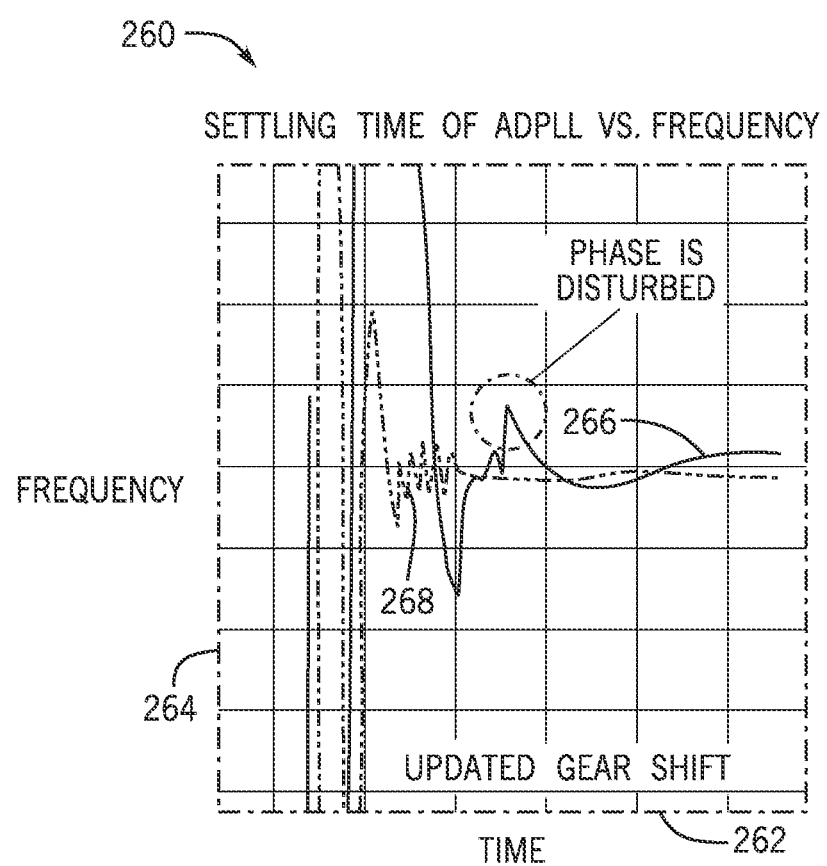
FIG. 15 is a plot illustrating example settling times of an example ADPLL of FIG. 5, according to embodiments of the present disclosure.

The DCO circuitry 110 may include all digital PLL circuitry (ADPLL) 112. The ADPLL 112 may generate and send a clock signal 114 to the processor 12. The ADPLL 112 may generate the clock signal 114 based on a lock it has with a reference signal. The ADPLL 112 may make a frequency adjustment to a variable signal (e.g., an output from a digitally controller oscillator) based on a phase difference between a reference signal (e.g., a reference clock signal) and the variable signal, as is further described in FIG. 15. When the ADPLL 112 is locked, the clock signal 114 output by the ADPLL 112 may have stabilized in its value (e.g., in its output behavior relative to the input) and represent an expected output value based on the overall frequency characteristics of a feedback loop of the ADPLL 112 (e.g., feedback loop 278 of FIG. 15). The processor 12 may generate and send an indication of a loop gain (a) (herein, "amplification parameter 116"). It is noted that although the loop gain is described herein as corresponding to a parameter, it may be represented in a variety of suitable forms, including one or more constants, data transmitted from the processor 12 to the digital loop filter 118, data that the digital loop filter 118 accessed in a register previously populated by the processor 12, one or more control signals implementing a gain change, or the like.

A digital loop filter 118 included in the ADPLL 112 may receive the amplification parameter 116. The digital loop filter 118 may also receive a gear trigger control signal 120 (gear_retime signal) that may advance latching circuitry to apply the amplification parameter 116 to at least a portion of the digital loop filter 118. Sometimes, the digital loop filter 118 receives a gear trigger control signal 120, which may be used in conjunction with additional logic circuitry to align an application of the amplification parameter 116 to the digital loop filter 118 to a rising or falling edge of a clock (e.g., a clocking transition).

The ADPLL 112 may also include time-to-digital converter (TDC) processing circuitry 124 and PLL lock detector 126. The DCO circuitry 110 (e.g., DCO circuitry 92, DCO circuitry 72), the local oscillator circuitry (e.g., local oscillator 66 and/or local oscillator 84), and/or the processor 12, or the like, may perform operations or otherwise monitor the PLL lock detector 126 to identify when the ADPLL 112 has locked on to recover the clock signal 114. The ADPLL 112 may send the clock signal 148 while or after achieving the lock. The PLL lock detector 126 may transmit an indication, or may update a stored value serving (e.g., read as) an indication, when the lock has occurred based on one or more signals received from the TDC processing circuitry 124 and/or one or more signals received from the digital loop filter 118.

Figure 6:
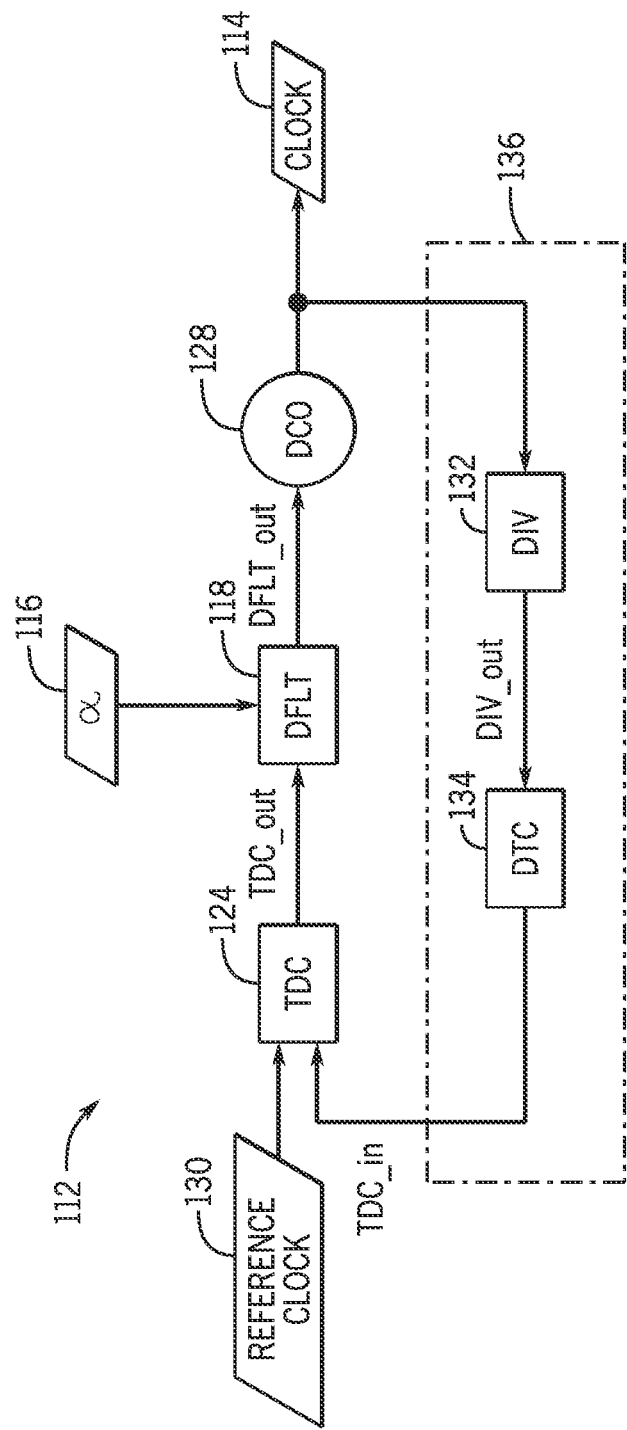
FIG. 6 is a block diagram of an example ADPLL of FIG. 5 that includes the digital loop filter described further in FIGS. 7 and 11, according to embodiments of the present disclosure.

Describing now the ADPLL 112 in further detail, FIG. 6 is a block diagram of an example ADPLL 112 that includes the digital loop filter 118 (e.g., the digital loop filter of FIG. 7 or circuit 210 of FIG. 12) and a digitally controller oscillator (DCO) 128. The ADPLL 112 may receive a reference clock signal 130 and generate the clock signal 114 based on the reference clock signal 130. The clock signal 114 may be based on an output from the digital loop filter 118 (e.g., DFLT_out signal). The ADPLL 112 also generates the clock signal 114 based on the TDC 124 outputs (e.g., TDC_out signal). A divider 132 and a digital-to-time converter 134 may be included in a feedback loop 136 to process an output from the DCO 128 (e.g., the clock signal 114) into a format usable by the TDC 124 (e.g., a time-based formatted TDC_in signal), where an intermediate signal generated may be a DIV_out signal.

Figure 7:
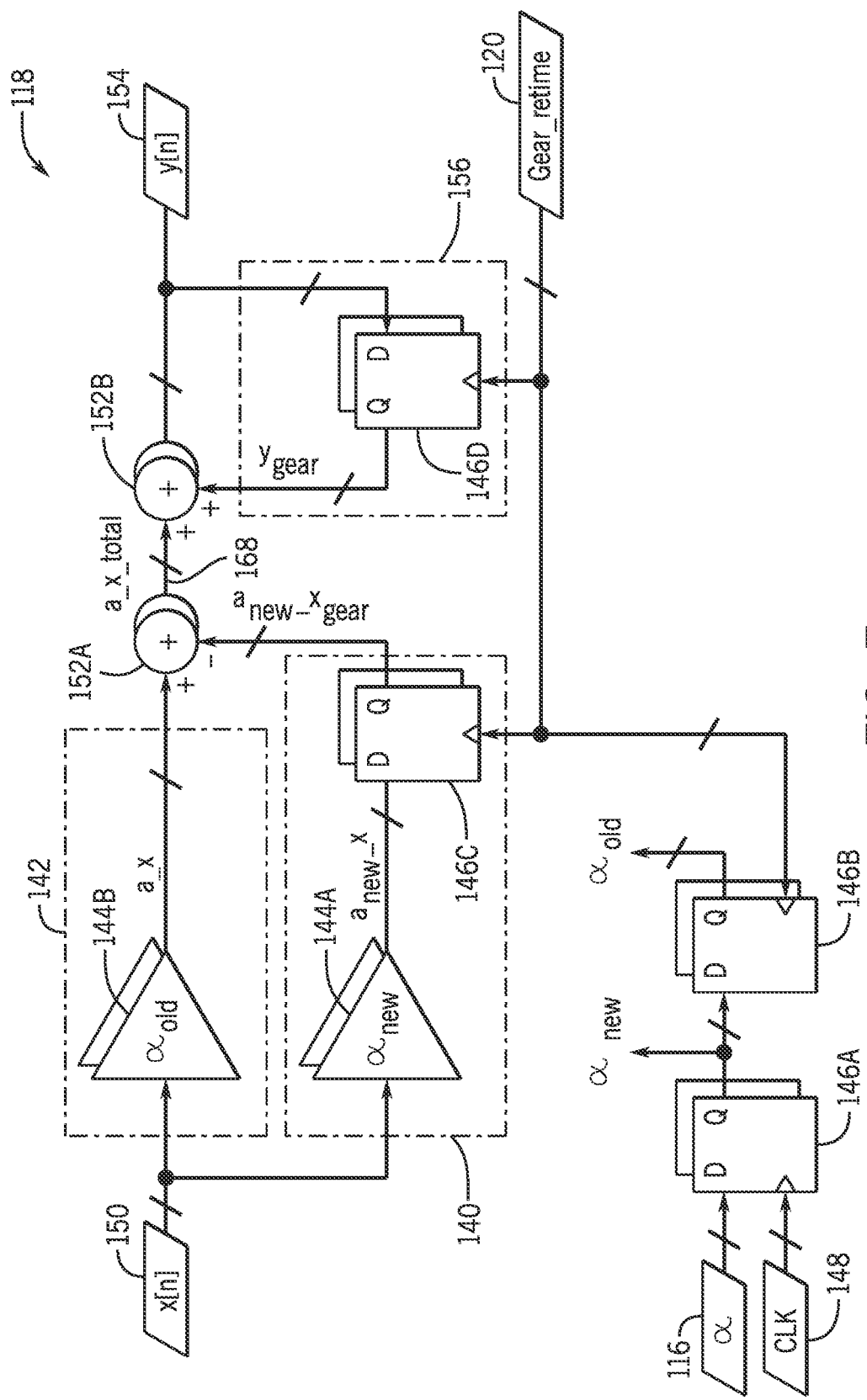
FIG. 7 is a first example schematic diagram of the digital loop filter of FIG. 5, according to embodiments of the present disclosure.

Continuing on to describe the digital loop filter 118 in further detail, FIG. 7 is a schematic diagram of at least a portion of the digital loop filter 118, according to embodiments of the present disclosure. The digital loop filter 118 may include a first path 140 and a second path 142, which each include a set of multipliers 144 (e.g., first set of multipliers 144A, second set of multipliers 144B). The digital loop filter 118 may also include a feedback loop 156 path. It is noted that the portion of the digital loop filter 118 depicted in FIG. 7 is disposed in a proportional path of the ADPLL 112. The input/output behavior of the digital loop filter 118 may be changed in response to receiving the amplification parameter 116.

The digital loop filter 118 may also include one or more sets of flip-flops 146 (e.g., a first set of flip-flops 146A, a second set of flip-flops 146B, a third set of flip-flops 146C, a fourth set of flip-flops 146D), where each of the sets of flip-flops 146 include one or more flip-flops. The sets of flip-flops 146 may be memory operated to temporarily store one or more values of an amplification parameter 116 and/or one or more values corresponding to a previous output signal. Although depicted as a set of two flip-flops and a single wire, it should be understood that each set of flip-flops 146 may include any number of flip-flops and each wire may represent multiple wires. The first set of flip-flops 146A may have a number of individual flip-flops equal to that of the second set of flip-flops 146B. The first set of flip-flops 146A may have a number of individual flip-flops equal to that of the third set of flip-flops 146C. Indeed, the multiplicity of components may enable transmission of a multi-bit number as the amplification parameter 116 as opposed to a single flip-flop and wire combination that may transmit a single bit, which may permit more relatively complex loop gain changes schemes to be implemented.

As will be further described below, the digital loop filter 118 may operate to receive an initial amplification parameter 116 that, as it is changed over time, is sent from circuitry of the second path 142 to circuitry of the first path 140 to help incrementally shift a bandwidth of the digital loop filter 118. The first set of flip-flops 146A may output an amplification parameter 116 to the second set of flip-flops 146B and to the first set of multipliers 144A in the second path 142 in response to a clock signal 148. The second set of flip-flops 146B may send the amplification parameter 116 (e.g., as a first amplification parameter) to the second set of multipliers 144B in response to a gear trigger control signal 120 before the first set of flip-flops 146A sends a new amplification parameter 116 to the second set of flip-flops 146B (e.g., as a second amplification parameter). Thus, an input signal 150 (x[n]) received at the digital loop filter 118, once a first amplification parameter 116 ($\alpha_1$) is loaded into the second set of multipliers 144B and a second amplification parameter 116 ($\alpha_2$) is loaded into the first set of multipliers 144A, may be modified by the amplification parameters 116 and via adders 152 (e.g., a first set of adders 152A, a second set of adders 152B). Signals modified by the amplification parameters 116 may be combined at a first set of adders 152A and sent via an adding path 168 between the adders 152 to be combined with a output signal 154 (y[−1]=$y_{gear}$) to generate a present output signal 154 y[n]. The output signal 154 (y[n−1]) from a previous operation may be fed back via feedback loop 156 for use in the present operation to generate the output signal 154 (y[n]). Indeed, as will be appreciated, the interactions between the second path 142, the first path 140 and/or the feedback loop 156 may improve a response of the digital loop filter 118 to a change in the amplification parameters 116 (e.g., which ultimately may change the bandwidth of the ADPLL 112). Improving the response of the digital loop filter 118 to the change in amplification parameter 116 may prevent, or reduce a likelihood of, the digital loop filter 118 from being disturbed to a point that the ADPLL 112 may lose its lock when generating the clock signal 114 of FIG. 5.

Figure 8A:
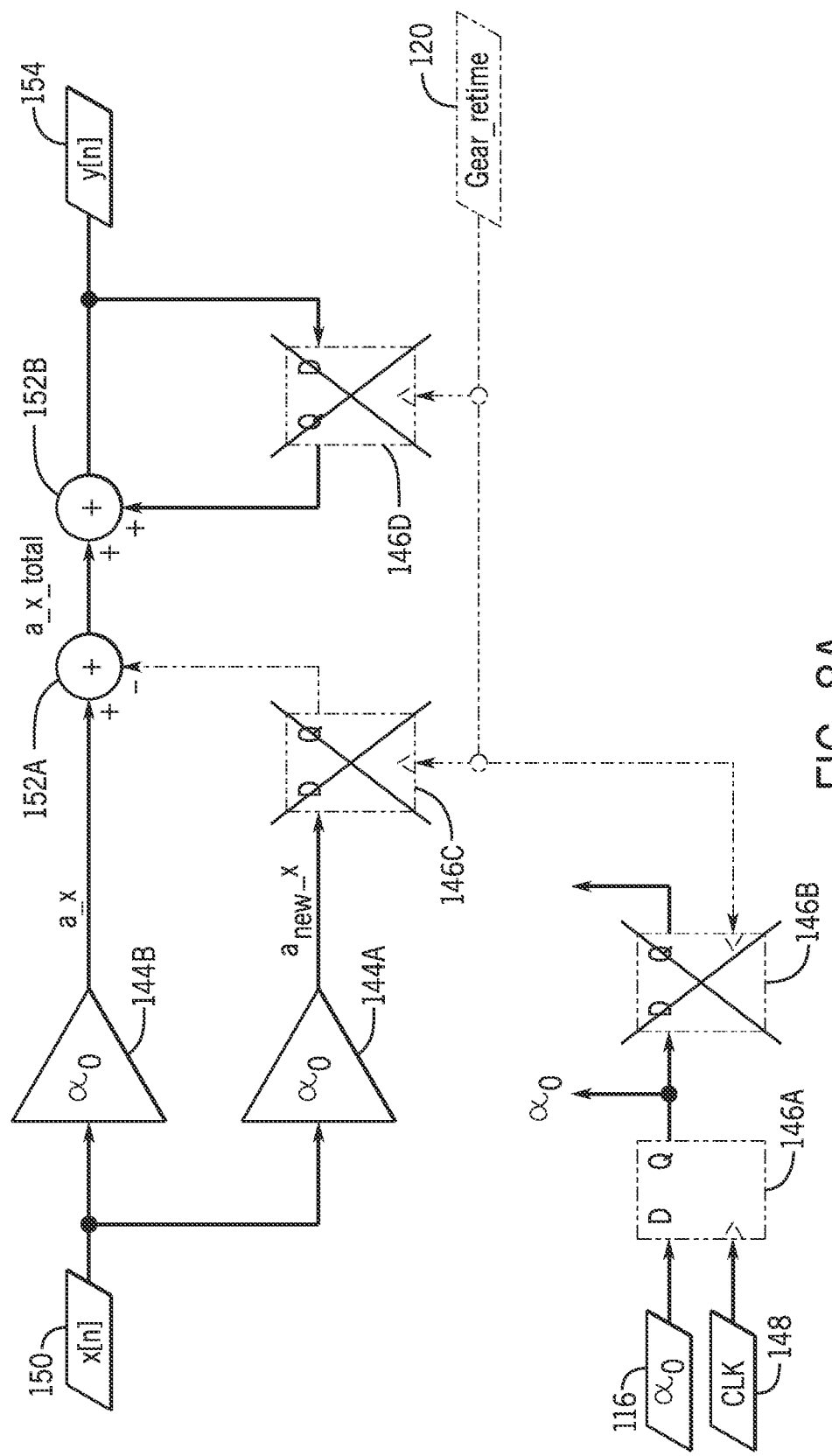
FIGS. 8A-8D are schematic diagrams of the digital loop filter of FIG. 7 implementing a loop gain change over time, according to embodiments of the present disclosure.
Figure 8B:
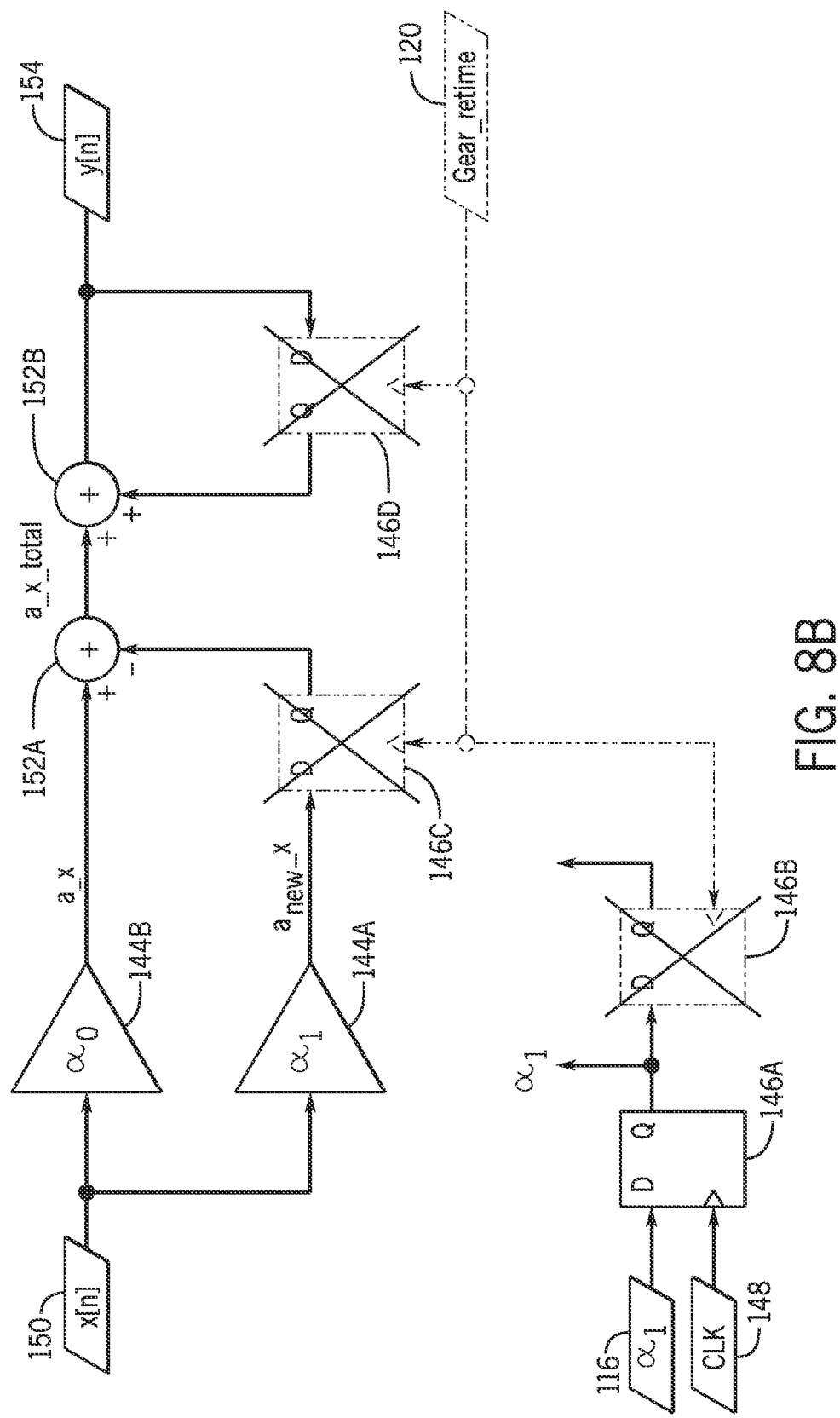
Figure 8C:
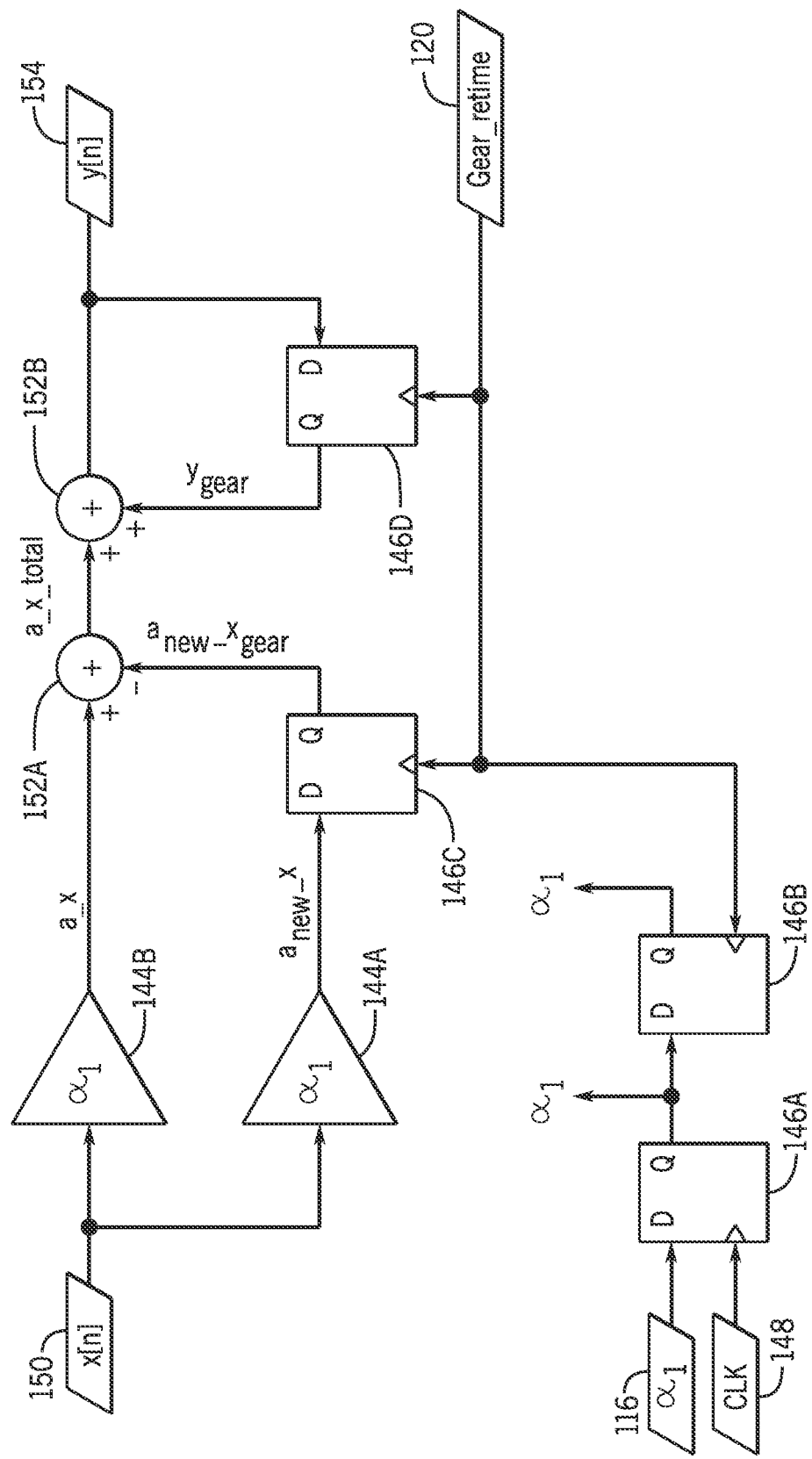
Figure 8D:
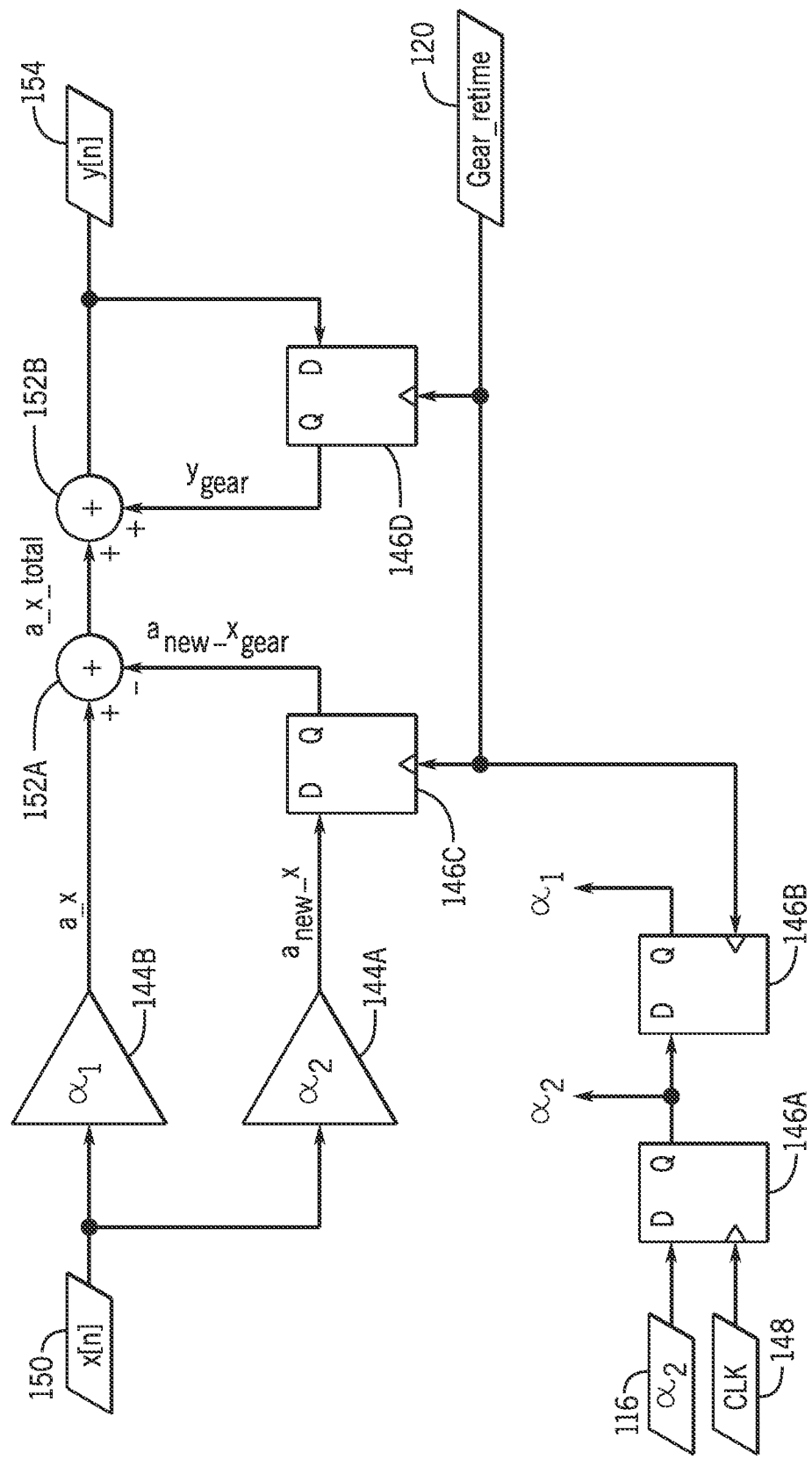
Figure 9:
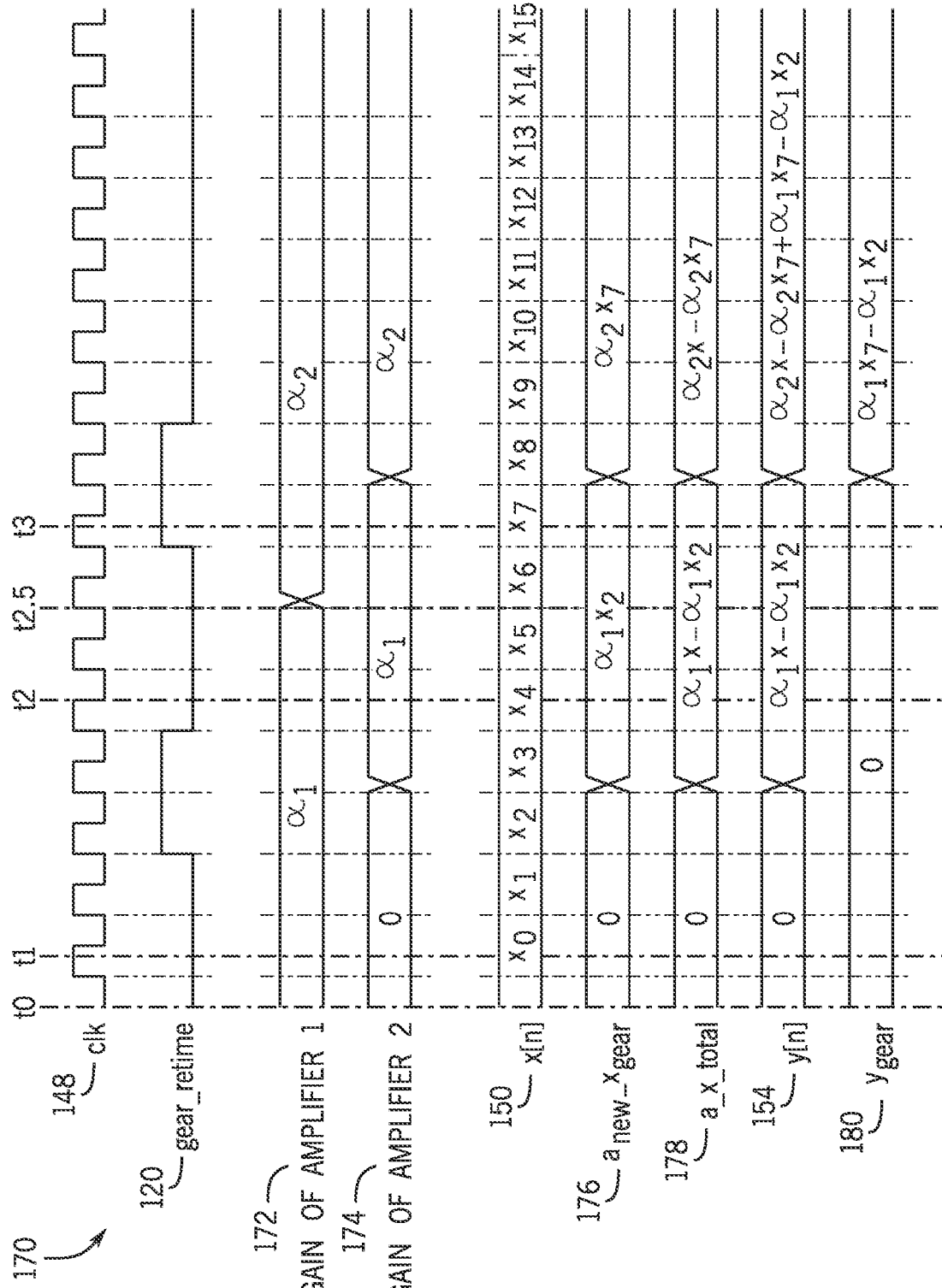
FIG. 9 is a timing diagram corresponding to the digital loop filter of FIG. 7 implementing the loop gain change shown via FIGS. 8A-8D, according to embodiments of the present disclosure.

Referring now to FIG. 7 in parallel with FIGS. 8A-8D and 9, FIGS. 8A-8D are schematic diagrams of the digital loop filter 118 of FIG. 7 implementing, over time, a loop gain change, and FIG. 9 is a timing diagram 170 corresponding to the digital loop filter 118 of FIG. 7 implementing the loop gain change shown via FIGS. 8A-8D, according to embodiments of the present disclosure. It is noted that each of the components shown here may represent one or more components as described above, for example to enable transmission of a multi-bit amplification parameter 116 and/or a multi-bit input signal 150 (x[n]). Referring to FIG. 9, FIG. 8A corresponds to an initial state before time t0, time t1 corresponds to FIG. 8B, time t2 corresponds to FIG. 8C, and time t3 corresponds to FIG. 8D. Furthermore, FIG. 9 illustrates respective timings of the clock signal 148, the gear trigger control signal 120, a signal 172 corresponding to the gain of the first set of multipliers 144A, a signal 174 corresponding to the gain of the second set of multipliers 144B, the input signal 150 (x[n]), an output data signal 176 ($a_{new\_}x_{gear}$) from the third set of flip-flops 146C, an output data signal 178 (a_x_total) from the first set of adders 152A, an output signal 154 (y[n]) from the digital loop filter 118, and a feedback output signal 180 ($y_{gear}$) from the fourth set of flip-flops 146D.

In FIG. 8A, the digital loop filter 118 may be in an initial state (e.g., prior to applying an amplification parameter). The processor 12 of FIG. 5 may send an initial amplification parameter 116 ($\alpha_0$) to the digital loop filter 118. The first set of flip-flops 146A may receive the initial amplification parameter 116 ($\alpha_0$) and, in response to a transition in the clock signal 148 (e.g., a rising edge), may send the initial amplification parameter 116 ($\alpha_0$) to the first set of multipliers 144A. The initial amplification parameter 116 ($\alpha_0$) may be 1 or some other initialization constant initially loaded into one or both of the multipliers 144, and the output signal 154 (y[n]) may be based on the initial amplification parameter 116 ($\alpha_0$) and the value of the input signal 150 (x[n]) (e.g., y[n]=$\alpha_0$*x[n]). In some cases, the initial amplification parameter 116 ($\alpha_0$) is zero. Referring to FIG. 9, the initial signal may be present prior to a first rising edge of the clock signal 148 as shown in the timing diagram. While in the initial state, all signals may be zero (e.g., $\alpha_0$=0)) except for the clock signal 148, which may be clocking.

At some time, the processor 12 may determine to change a loop bandwidth via the digital loop filter 118 and may send the first amplification parameter 116 ($\alpha_1$) to the digital loop filter. To do so, first amplification parameter 116 ($\alpha_1$) may be transmitted to the first set of the flip-flops 146A, which is latched and output to the first set of multipliers 144A on a rising edge of the clock signal 148. In this way, before t0, the first set of flip-flops 146A may receive the first amplification parameter 116 ($\alpha_1$). Between t0 and t1, bits of the first amplification parameter 116 ($\alpha_1$) may await respective loading at the inputs to the first set of flip-flops 146A.

At t1, the first set of multipliers 144A may receive the first amplification parameter 116 ($\alpha_1$) from the first set of flip-flops 146A in response to the previous clocking transition of the clock signal 148. The first set of multipliers 144A may change gain based on or to equal the first amplification parameter 116 ($\alpha_1$) as shown by the signal 172. The other signals may remain unchanged aside from the input signal 150 (x[n]), which equals a subsequent value (e.g., x[n]=$x_0$) at t1. Since the gear trigger control signal 120 has not pulsed, the first amplification parameter 116 ($\alpha_1$) is held at the input of the second set of flip-flops 146B, as generally represented in FIG. 8B.

Between t1 and t2, the processor 12 may pulse the gear trigger control signal 120. In response to a change in the gear trigger control signal 120, the second set of flip-flops 146B latches the first amplification parameter 116 ($\alpha_1$) from the respective inputs. Once latched, the output from the second set of flip-flops 146B transmits the respective bits of the first amplification parameter 116 ($\alpha_1$) to the respective multipliers of the second set of multipliers 144B. This is represented in the value change of the gain of the second set of multipliers 144B shown in FIG. 9 as the signal 174. Once loaded, for example at t2, both the first set of flip-flops 146A and the second set of flip-flops 146B store the first amplification parameter 116 ($\alpha_1$), as generally represented in FIG. 8C.

Between t2 and t3, the processor 12 may send the second amplification parameter 116 ($\alpha_2$) to the digital loop filter 118, which receives it at the inputs to the first set of flip-flops 146A. Time t2.5 corresponds to when the clock signal 148 transitions, causing the first set of flip-flops 146A to latch the second amplification parameter 116 ($\alpha_2$), which overwrites a previously stored indication of the amplification parameter 116 ($\alpha_1$), and output the second amplification parameter 116 ($\alpha_2$) to the first set of multipliers 144A. Since the gear trigger control signal 120 has yet to pulse at t2.5, the second amplification parameter 116 ($\alpha_2$) output from the first set of flip-flops 146A is held at the input to the second set of flip-flops 146B.

At t3, the gear trigger control signal 120 may transition to a logic high state, which causes the second set of flip-flops 146B to latch the second amplification parameter 116 ($\alpha_2$) output from the first set of flip-flops 146A. FIG. 8D corresponds to t3. The processor 12 may transmit another gear trigger control signal 120 pulse to store in the second amplification parameter 116 ($\alpha_2$) in the second set of flip-flops 146B and the second set of multipliers 144B. The first amplification parameter 116 ($\alpha_1$) may not be stored in the digital loop filter 118 at this point and may be overwritten by the second amplification parameter 116 ($\alpha_2$) in the second set of flip-flops 146B and the second set of multipliers 144B. In this operational state, the input signal 150 (x[n]=$x_7$) may be adjusted based on the first amplification parameter 116 ($\alpha_1$), the second amplification parameter 116 ($\alpha_2$), and the previous output signal (y[n]=$y_6$), which here is 0 but for subsequent operations may equal another value based on interim operations (e.g., $\alpha_1 x_7$-$\alpha_1 x_2$), represented in the feedback output signal 154 ($y_{gear}$) of the timing diagram.

In this way, the first set of flip-flops 146A may be operated to load the first amplification parameter 116 ($\alpha_1$). The second path 142 of the digital loop filter 118 may include one or more first digital multipliers 144A operable to receive the first amplification parameter 116 ($\alpha_1$) from the first set of flip-flops 146A. The digital loop filter 118 may include a second set of flip-flops operable to load a second amplification parameter 116 ($\alpha_2$). The first path 140 may include one or more second digital multipliers 144B operable to receive the second amplification parameter 116 ($\alpha_2$) from the second set of flip-flops 146B. The feedback loop 156 of the digital loop filter 118 may include the fourth set of flip-flops 146D and may be operated to feedback a previously generated output signal (y[n−1]=$y_{gear}$) to a second set of adders 152B (e.g., one or more summation circuits).

Figure 10:
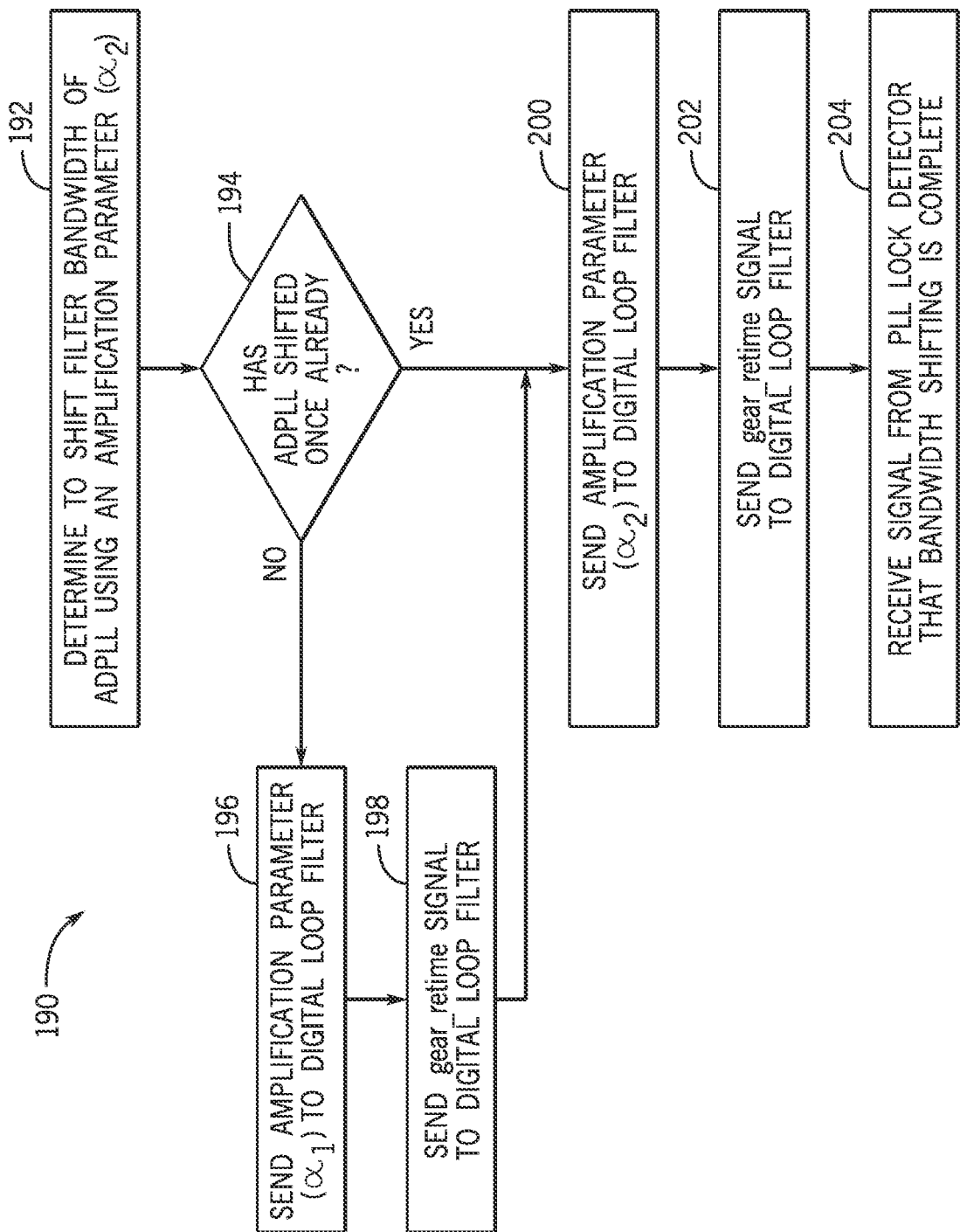
FIG. 10 is a flowchart of a method of operating the digital loop filter of FIG. 7 to implement the loop gain change shown via FIGS. 8A-8D, according to embodiments of the present disclosure.

Keeping the foregoing in mind, FIG. 10 is a flowchart of a method 190 of operating the digital loop filter 118 of FIG. 7 to implement a loop gain change utilizing an ability to change the loop gain an unlimited amount of times with reduced footprint based on receiving the loop gain from the processor 12, as illustrated via FIGS. 8A-8D and according to embodiments of the present disclosure. Reference herein may be made together to at least FIGS. 5-9. Any suitable device (e.g., a controller) that may control components of the electronic device 10, such as the processor 12, may perform the method 190. In some embodiments, the method 190 may be implemented by executing instructions stored in a tangible, non-transitory, computer-readable medium, such as the memory 14 or storage 16, using the processor 12. For example, the method 190 may be performed at least in part by one or more software components, such as an operating system of the electronic device 10, one or more software applications of the electronic device 10, and the like. While the method 190 is described using steps in a specific sequence, it should be understood that the present disclosure contemplates that the described steps may be performed in different sequences than the sequence illustrated, and certain described steps may be skipped or not performed altogether.

In process block 192, the processor 12 determines to shift a loop bandwidth of the ADPLL 112 using an amplification parameter (e.g., second amplification parameter, $\alpha_2$). The processor 12 may determine to change the bandwidth in response to an indication from another electronic device, such as a user equipment or a network-side system, like a core network or a base station. The change in bandwidth may be triggered in response to changing a connection type or quality associated with the transmitter 52 and/or receiver 54. Other suitable conditions that may cause the processor 12 to determine to shift a loop bandwidth are contemplated.

In decision block 194, the processor 12 determines whether the ADPLL 112 has already been shifted once (e.g., is no longer in an initial state, is no longer in a zero state). The processor 12 may do so by reading a register that may change state or store data indicative of the ADPLL 112 being shifted out of an initial state, though other suitable methods are contemplated. In response to determining that the ADPLL 112 is still in an initial state or a zero state, in process block 196, the processor 12 sends the first amplification parameter 116 ($\alpha_1$) to the digital loop filter 118. The digital loop filter 118 first loads the first amplification parameter 116 ($\alpha_1$) in the first set of flip-flops 146A and the first set of multipliers 144A.

In process block 198, the processor 12 sends the gear trigger control signal 120 to the digital loop filter 118. In response to receiving the gear trigger control signal 120, the digital loop filter 118 loads the first amplification parameter 116 ($\alpha_1$) in the second set of flip-flops 146B, which then causes the second set of multipliers 144B to receive the first amplification parameter 116 ($\alpha_1$) from an output from the second set of flip-flops 146B.

If, at the decision block 194, the processor 12 determines that the ADPLL 112 has already been shifted once, or at the completion of the process block 198, the processor 12 sends the second amplification parameter 116 ($\alpha_2$) to the digital loop filter 118 at process block 200. The digital loop filter 118 loads the second amplification parameter 116 ($\alpha_2$) in the first set of flip-flops 146A and the first set of multipliers 144A in response to a transition in the clock signal 148. While the second amplification parameter 116 ($\alpha_2$) is loaded in the first set of flip-flops 146A and the first set of multipliers 144A, and the first amplification parameter 116 ($\alpha_1$) is loaded in the first set of flip-flops 146A and the first set of multipliers 144A, the ADPLL 112 may send the input signal 150 to the digital loop filter 118 to implement the bandwidth change. The input signal 150 may be adjusted based on the first amplification parameter 116 ($\alpha_1$), the second amplification parameter 116 ($\alpha_2$), and the previously sent output signal 154 (e.g., y[n−1]) fed back via the fourth set of flip-flops 146D.

In process block 202, the processor 12 sends the gear trigger control signal 120 pulse to the digital loop filter 118. In response to receiving the gear trigger control signal 120 pulse, the output from the first set of multipliers 144A transmits to the first set of adders 152A via the third set of flip-flops 146C. The output from the first set of adders 152A transmits to the second set of adders 152B. Furthermore, in response to the gear trigger control signal 120 pulse, the output signal 154 (e.g., $y_{gear}$) previously transmitted from digital loop filter 118 is sent via the fourth set of flip-flops 146D to the second set of adders 152B. At the second set of adders 152B, the output from the first set of adders 152A (e.g., the input signal 150 (x[n]) modified based on the first amplification parameter 116 ($\alpha_1$) and the second amplification parameter 116 ($\alpha_2$)) and the output from the fourth set of flip-flops 146D (e.g., $y_{gear}$) combine to generate the output signal 154 (y[n]).

In process block 204, the processor 12 receives a signal from the PLL lock detector 126 that indicates the bandwidth shifting is complete. The PLL lock detector 126 may indicate the completed bandwidth shifting in response to the digital loop filter 118 generating the output described in process block 202. In this manner, the method 190 enables the ADPLL 112 to generate an output signal 154 based on a previously transmitted output signal 154 and amplification parameters 116 received from the processor 12 without restrictions on a number of times a bandwidth of the ADPLL 112 is able to be changed and to reduce an impact to the locked state of the ADPLL 112.

Figure 11:
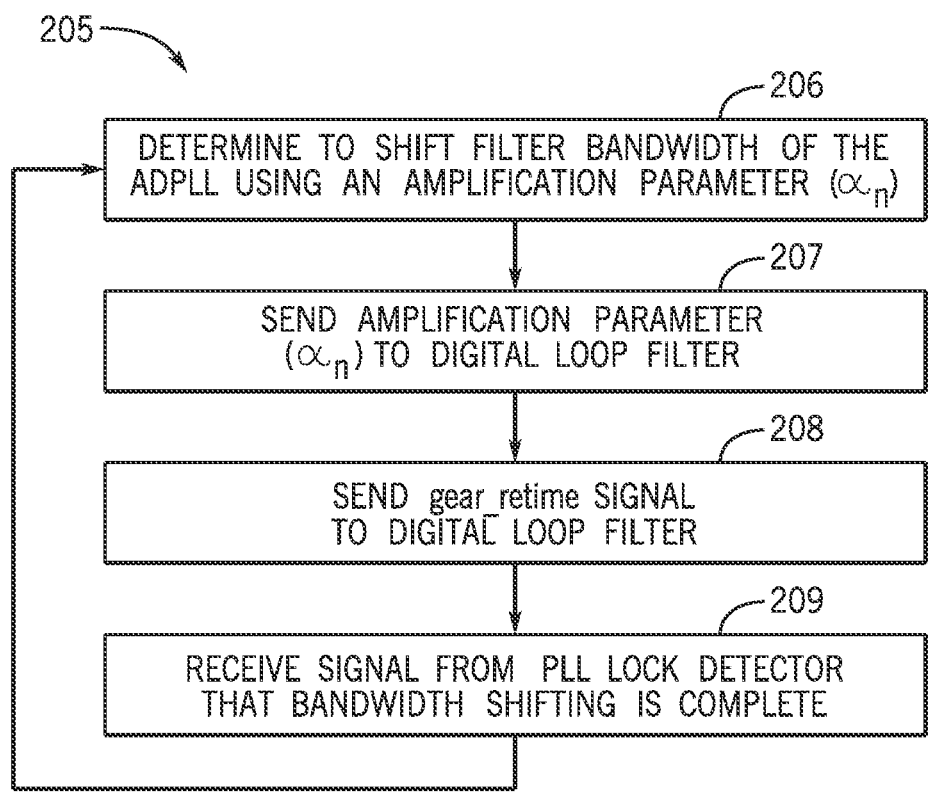
FIG. 11 is a flowchart of a method of operating the digital loop filter of FIG. 7 to implement the loop gain change shown via FIGS. 8A-8D using an amplification parameter, $\alpha_n$, that may be updated any number of times to implement any number of changes to the loop gain, according to embodiments of the present disclosure.

The ADPLL 112 may enable the loop bandwidth to be shifted any number of times. To elaborate, FIG. 11 is a flowchart of a method 205 of operating the digital loop filter 118 of FIG. 7 to implement a loop gain change utilizing an ability to change the loop gain an unlimited amount of times with reduced footprint based on receiving the loop gain from the processor 12, as illustrated via FIGS. 8A-8D and according to embodiments of the present disclosure. Reference herein may be made together to at least FIGS. 5-9. Any suitable device (e.g., a controller) that may control components of the electronic device 10, such as the processor 12, may perform the method 205. Furthermore, some of the operations of FIG. 11 may be similar to those performed in the method 190 of FIG. 10, and thus those descriptions are relied on herein without specific reference. In some embodiments, the method 205 may be implemented by executing instructions stored in a tangible, non-transitory, computer-readable medium, such as the memory 14 or storage 16, using the processor 12. For example, the method 205 may be performed at least in part by one or more software components, such as an operating system of the electronic device 10, one or more software applications of the electronic device 10, and the like. While the method 205 is described using steps in a specific sequence, it should be understood that the present disclosure contemplates that the described steps may be performed in different sequences than the sequence illustrated, and certain described steps may be skipped or not performed altogether.

In process block 206, the processor 12 determines to shift a loop bandwidth of the ADPLL 112 using an amplification parameter 116 (e.g., amplification parameter, an). When the method 205 is performed as a next operation following operations of process block 204, the amplification parameter 166 may correspond to $\alpha_3$.

In process block 207, the processor 12 sends the amplification parameter 116 to the digital loop filter 118. The digital loop filter 118 may receive the amplification parameter 116 at one or more inputs associated with one or more of the first set of the flip-flops 146A. In response to a clocking transition in the clock signal 148, the amplification parameter 116 is sent to the first set of multipliers 144A, which may cause one or more of the first set of multipliers 144A to change an amount of gain by which an amplitude of the input signal 150 transmitted through the first set of multipliers 144A is affected with. Since the gear trigger control signal 120 has not changed state again, the amplification parameter 116 received by the digital loop filter 118 at block 207 has not yet propagated to the second set of flip-flops 146B. Thus, at this point, the first set of multipliers 144A has a gain based on the amplification parameter 116 of process block 207 and the second set of multipliers 144B has a gain based on the amplification parameter 116 from the most recent previous loop bandwidth (e.g., amplification parameter, $\alpha_{n-1}$). For the case where the method 205 is performed following the method 190, the amplification parameter 116, $\alpha_{n-1}$, corresponds to the amplification parameter 116 sent at block 200.

In process block 208, the processor 12 sends the gear trigger control signal 120 to the digital loop filter 118. In response to the gear trigger control signal 120, one or more of the second set of flip-flops 146B may receive and store the amplification parameter 116 (e.g., an sent at process block 207), which causes the amplification parameter 116 to transmit to the second set of multipliers 144B. In response to receiving the amplification parameter 116, one or more of the second set of multipliers 144B may change an amount of gain used to affect an amplitude of the input signal 150 transmitted through the second set of multipliers 144B is affected with. The gear trigger control signal 120 also causes the third set of flip-flops 146C and the fourth set of flip-flops 146D to transmit signals previously waiting at inputs to the respective flip-flops.

In process block 209, the processor 12 may receive a signal from the PLL lock detector 126 that indicates the bandwidth shifting is complete. The PLL lock detector 126 may indicate the completed bandwidth shifting in response to the digital loop filter 118 generating the output signal 154. In this manner, the method 205 enables the ADPLL 112 to generate an output signal 154 based on a previously transmitted output signal 154 (e.g., output corresponding to process blocks 202 and 204 of method 190 in the case where method 205 is performed after method 190, output from a previous performance of process blocks 208 and 209) and an amplification parameter 116 received from the processor 12 without restrictions on a number of times a bandwidth of the ADPLL 112 is able to be changed and to reduce an impact to the locked state of the ADPLL 112. Indeed, since the loop bandwidth may be adjusted an unlimited amount of times, the amplification parameter 116 sent at process block 207 may be changed and resent to the ADPLL 112 each time the loop bandwidth is to be changed (e.g., $\alpha_3, \alpha_4, \alpha_5, \ldots \alpha_n$). Whenever the loop bandwidth is to be changed, the method 205 may be repeated, as represented through the continuation arrow coupling the process block 209 to the process block 206.

Based on the method of 190 and/or the method 205 causing, the processor 12 may cause a transceiver to communicate using a first bandwidth at a first time and using a second bandwidth at a second time. The transceiver may include the ADPLL 112 and the digital loop filter 118. Moreover, the processor 12 may determine to shift the bandwidth to a third bandwidth using a third amplification parameter 116 and, in response to the determination, the processor may send the third amplification parameter 116 to the digital loop filter 118 to overwrite a previously transmitted amplification parameter 116. One or more enable signals (e.g., clock signal 148, gear trigger control signal 120) may be sent by the processor 12 to cause one or more flip-flops to store a sent amplification parameter 116 over an already stored amplification parameter 116.

Figure 12:
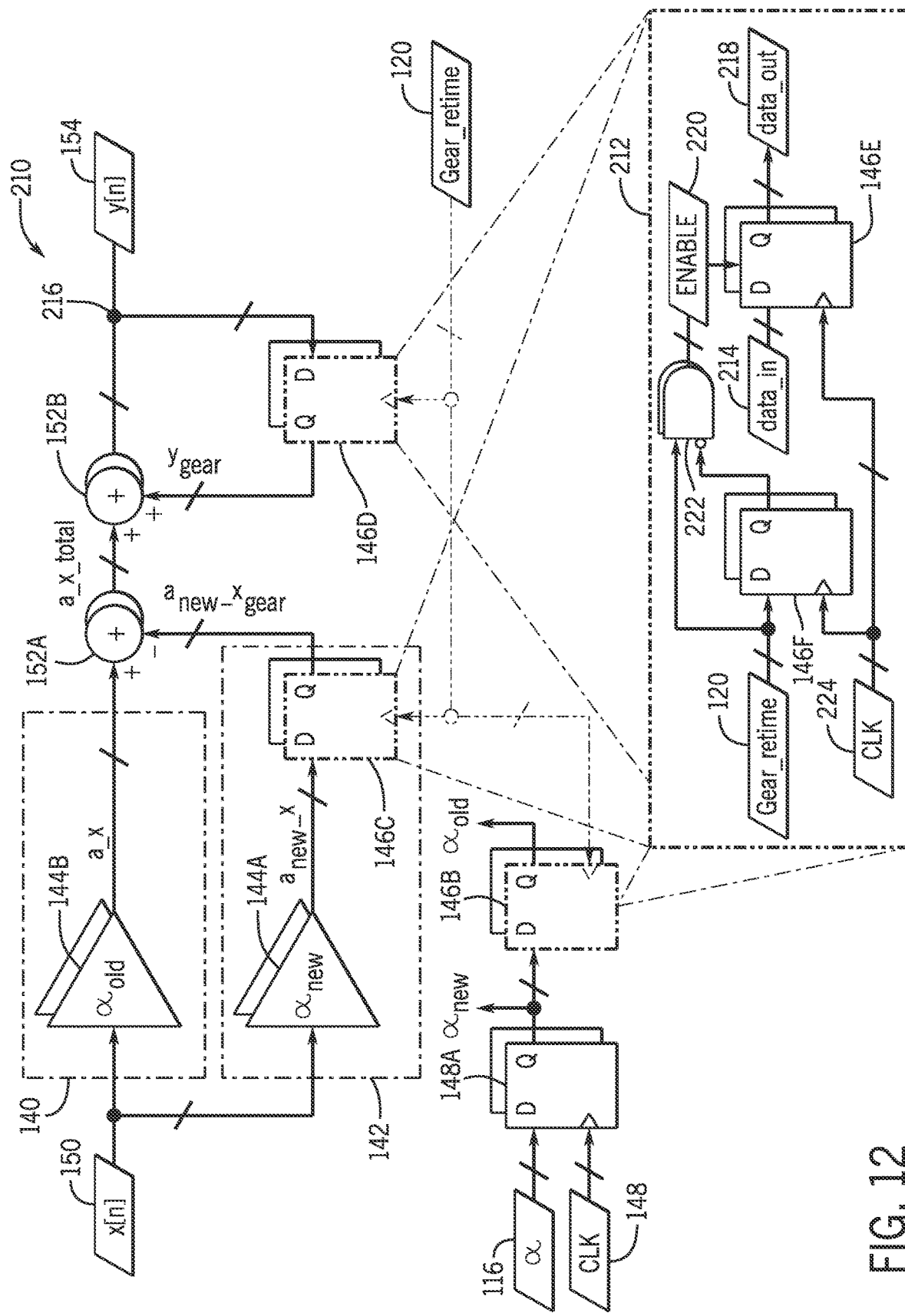
FIG. 12 is a second example schematic diagram of the digital loop filter of FIG. 5 used to align the loop gain change to a clock, according to embodiments of the present disclosure.

In some cases, it may be desired to align the transmission of the gear trigger control signal 120 to the clock signal 148 (or to another clock signal, like clock signal 114). To elaborate, FIG. 12 is a second example schematic diagram of a digital loop filter 118 of FIG. 5 (e.g., labelled circuit 210) used to align the toggling of the gear trigger control signal 120 to the clock signal 148, according to embodiments of the present disclosure. Many of the components of the digital loop filter 118 of FIG. 7 are repeated, and thus duplicate description is not made herein.

The second set of flip-flops 146B, the third set of flip-flops 146C, and the fourth set of flip-flops 146D are each represented via a dashed outline to indicate that they are replaced by the set of synchronization circuitry 212 shown in the inset figure when using the digital loop filter 118 (e.g., circuit 210). The gear trigger control signal 120 may be received at the data input of each of the flip-flops (e.g., of the sixth set of flip-flops 146F) as opposed to the clock terminal, as in the second set of flip-flops 146B, the third set of flip-flops 146C, and the fourth set of flip-flops 146D. For example, the couplings between the first set of flip-flops 146A and the second set of flip-flops 146B, the couplings between the first set of multipliers 144A and the third set of flip-flops 146C, and the couplings between the second set of adders 152B and the fourth set of flip-flops 146D may receive a data_in signal 214, as shown in the inset synchronization circuitry 212. The coupling between the output from the second set of flip-flops 146B and the second set of multipliers 144B, the coupling between the third set of flip-flops 146C and the first set of adders 152A, and the coupling between an output terminal 216 and the fourth set of flip-flops 146D may transmit a data_out signal 218, as shown in the inset synchronization circuitry 212.

When signals are received at a fifth set of flip-flops 146E, the signals are held at the input to the fifth set of flip-flops 146E until a rising edge of a clock signal 224 and enable signals 220 from AND logic gates 222 are received. The clock signal 224 may align with and/or include the clock signal 148. The gear trigger control signal 120 may not be used and instead selective transmission of the signals through the digital loop filter 118 may be timed by the gear trigger control signal 120 (gear_retime signal). Each of the AND logic gates 222 may include one inverted input and one non-inverted input. The AND logic gates 222 may output the enable signals 220 in response to the processor 12 sending one or more gear trigger control signals 120 to the digital loop filter 118 and in response to a clocking transition of the clock signal 224 received at a sixth set of flip-flops 146F. In this manner, the second set of flip-flops 146B, the third set of flip-flops 146C, and the fourth set of flip-flops 146D may delay transmitting received signals until the gear trigger control signal 120 is latched by the sixth set of flip-flops 146F and the clock signal 224 has a subsequent transition, thereby aligning outputs from the second set of flip-flops 146B, the third set of flip-flops 146C, and the fourth set of flip-flops 146D to the transitions of the clock signal 148. Comparing FIG. 12 to FIG. 7, the sets of flip-flops 146F and 146E operate responsive to at least the gear trigger control signal 120 received at a data input terminal of the flip-flops 146F as opposed to the gear trigger control signal 120 being received at the clock input terminal of the sets of flip-flops 146B, 146C, and 146D.

Keeping the foregoing in mind, the circuitry of FIG. 12 may be referred to as a portion of circuitry. In this way, a portion of the inset synchronization circuitry 212 may correspond to one or more of the AND logic gates 222, one or more of the set of flip-flops 146F, one or more of the set of flip-flops 146E, or a combination of these. In this way, a portion of the synchronization circuitry 212 (e.g., a first flip-flop of the set of flip-flops 146E) may couple to a first flip-flop of the set of flip-flops 146A, where the first flip-flops of the set of flip-flops 146E, 146A may correspond to a relative position of the other in the set of flip-flops such that a signal output from the first flip-flop of the set of flip-flops 146A may be received by the first flip-flop of the set of flip-flops 146E. The same portion of the synchronization circuitry 212 may include a third flip-flop (e.g., a first flip-flop of the set of flip-flops 146F) and a first logic gate of the AND logic gates 222 to send a portion of, or a respective signal of the enable signals 220 to the first flip-flop of the set of flip-flops 146E. Each of the AND logic gates 222 may respectively have an inverted input and a non-inverted input, where the inverted input may be coupled to a data output (Q) from respective flip-flops of the set of flip-flops 146F, and where the non-inverted input may be coupled to a data input (D) of respective flip-flops of the set of flip-flops 146F. The input of each respective flip-flop of the set of flip-flops 146F may be coupled to respective outputs of flip-flops of the set of flip-flops 14F. In this way, the enable signals 220 may each be considered respective enable signals 220 (e.g., a respective signal of a set of enable signals 220) or a respective signal may be considered a portion of an enable signal 220 (where the set of signals output from each of the AND logic gates 222 are together referred to as the enable signal 220 such that each respective signal transmitted is a portion of the enable signal 220).

Figure 13:
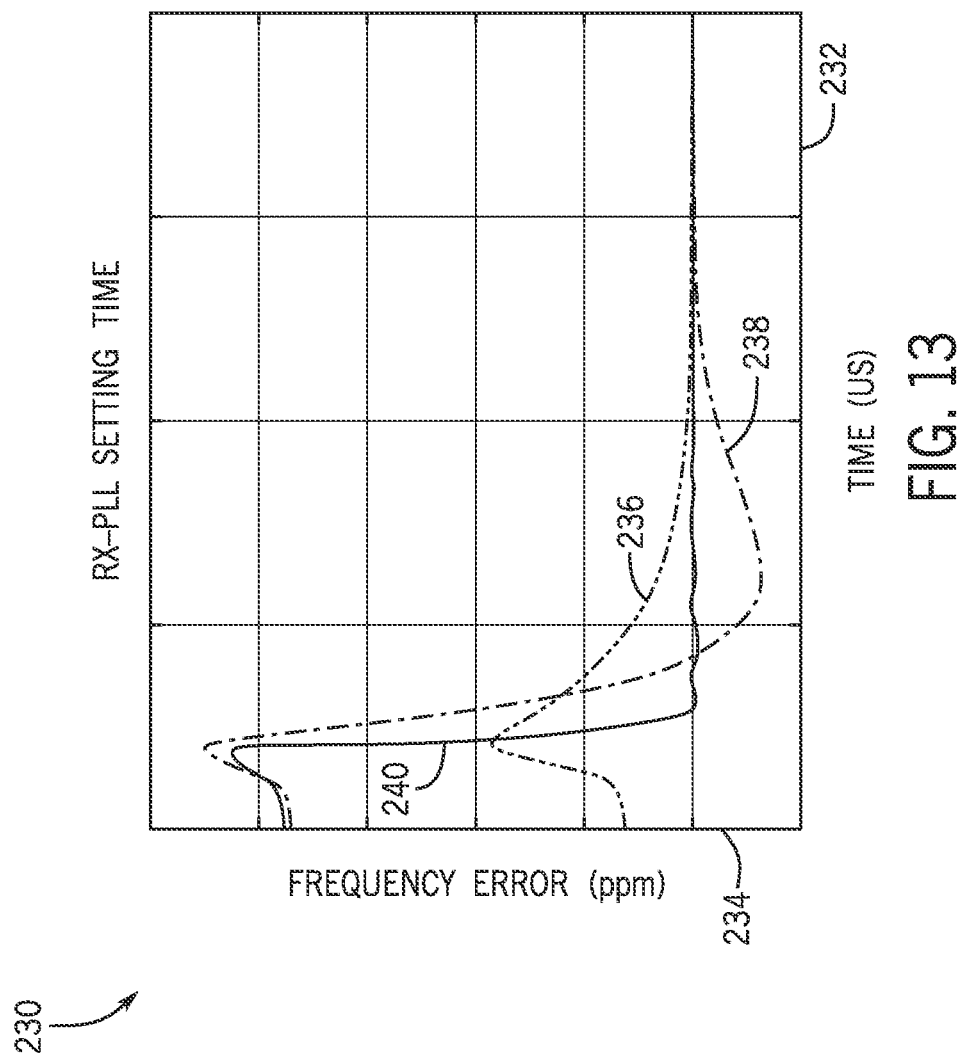
FIG. 13 is a plot illustrating example settling times of an example receiver of FIG. 4, according to embodiments of the present disclosure.

Referring now to FIG. 13, FIG. 13 is a plot 230 illustrating example settling times of an example receiver of FIG. 4, according to embodiments of the present disclosure. These example settling times may correspond to a BLUETOOTH® network mode. The plot 230 includes an abscissa 232 corresponding to time in microseconds (μs) and an ordinate 234 of frequency error in points per million (ppm). The plot 230 compares settling time of an example ADPLL 112 implemented in a receiver (e.g., the receiver 54) to an occurrence of frequency errors as part of a bandwidth change of the ADPLL 112 from 1.5 megahertz (MHz) to 600 kilohertz (kHz). A first relationship 236 plotted corresponds to a scenario where settings are used to cause a relatively small frequency error, which resulted in a settling time of approximately 8.5 μs. A second relationship 238 plotted corresponds to a scenario where settings are used to cause a relatively large frequency error, which resulted in a settling time of approximately 12.4 μs. Moreover, a third relationship 240 plotted corresponds to a scenario where settings are used to cause a relatively large frequency error but is mitigated with the bandwidth switching systems and methods of FIG. 5 and/or FIG. 12, which resulted in a settling time of approximately 3 μs. The plot 230 and the results may thus illustrate technical improvements related to using the described bandwidth switching systems and methods of FIG. 5 and/or FIG. 12.

Figure 14:
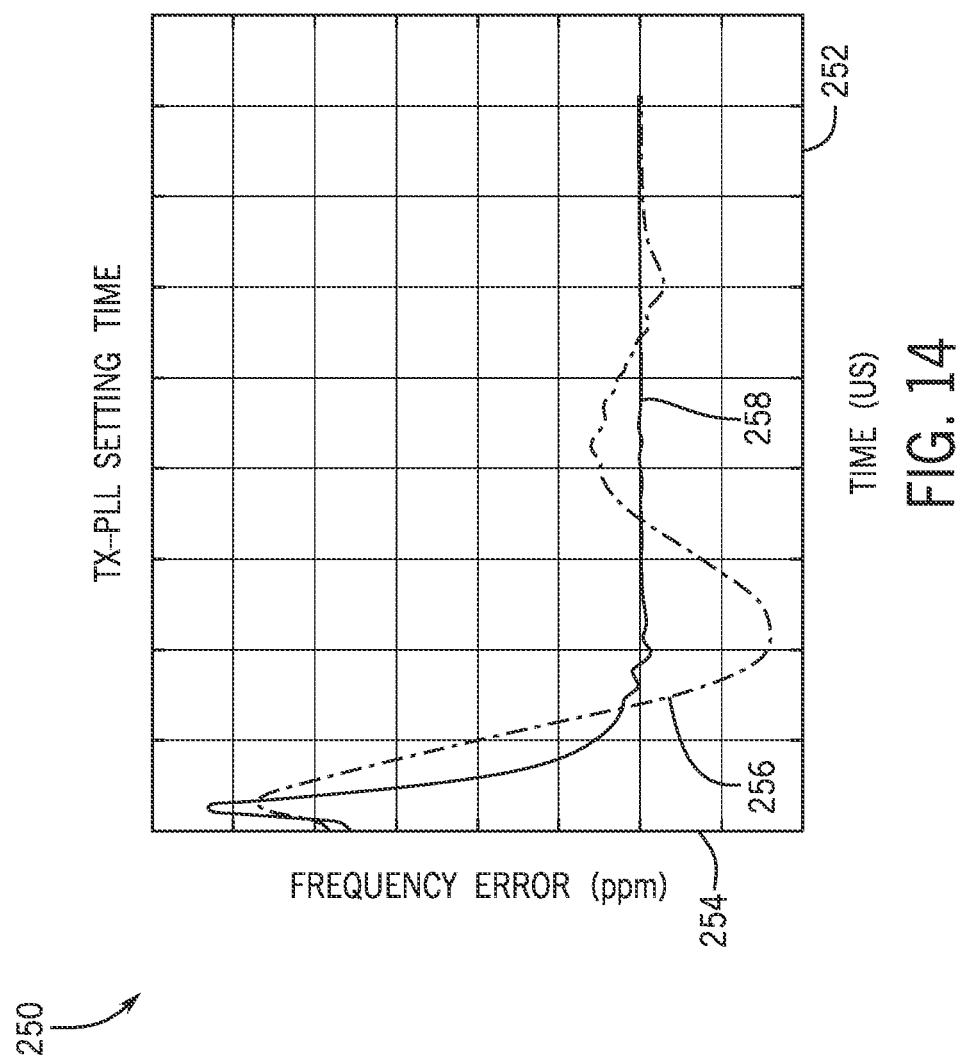
FIG. 14 is a plot illustrating example settling times of an example transmitter of FIG. 3, according to embodiments of the present disclosure.

Moreover, FIG. 14 is a plot 250 illustrating example settling times of an example transmitter of FIG. 3, according to embodiments of the present disclosure. These example settling times may correspond to a BLUETOOTH® network mode. The plot 250 includes an abscissa 252 corresponding to time in microseconds (p) and an ordinate 254 of frequency error in points per million (ppm). The plot 250 compares settling time of an example ADPLL 112 implemented in a transmitter to an occurrence of frequency errors as part of a bandwidth change of the ADPLL 112 from 600 kHz to 100 kHz. A first relationship 256 plotted corresponds to a scenario where settings are used to change bandwidth without mitigation to maintain the lock of the example ADPLL 112, which resulted in a settling time of approximately 34 μs. Moreover, a second relationship 258 plotted corresponds to a scenario where settings are used to change the bandwidth while maintaining the lock of the example ADPLL 112 using the bandwidth switching systems and methods of FIG. 5 and/or FIG. 12, which resulted in a settling time of approximately 3 μs. The plot 250 and the simulated results may thus illustrate technical improvements related to using the described bandwidth switching systems and methods of FIG. 5 and/or FIG. 12.

Furthermore, FIG. 14 is a plot 260 illustrating example settling times of an example ADPLL 112, similar to that illustrated in FIG. 5, according to embodiments of the present disclosure. The plot 260 includes an abscissa 262 corresponding to time in microseconds (μs) and an ordinate 264 of frequency (Hz). The plot 260 compares settling time of an example ADPLL 112 implemented in a transmitter to an occurrence of frequency. A first relationship 266 plotted corresponds to a scenario where settings are used to change bandwidth without mitigation, which results in a relatively greater disturbance to the frequency and loss of lock of the ADPLL. Moreover, a second relationship 268 plotted corresponds to a scenario where settings are used to change the bandwidth while maintaining the lock of the example ADPLL 112 using the bandwidth switching systems and methods of FIG. 5 and/or FIG. 12, which resulted in relatively lesser disturbance to the frequency. The plot 260 and the results may thus illustrate technical improvements related to using the described bandwidth switching systems and methods of FIG. 5 and/or FIG. 12.

Keeping the foregoing in mind, technical effects of the present disclosure include systems and methods that improve bandwidth shifting operations of an ADPLL without losing a lock of the ADPLL and having the benefit of being able to change the bandwidth an unlimited amount of times. A loop filter of the ADPLL may include a proportional path and an integrator path. Systems and methods described herein may enable the feedback of a previous output from the loop filter (previously limited to affecting the integrator path) to affect both the proportional and integrator paths, which may reduce a slope of the response and enable the ADPLL to maintain its lock to a reference signal. Indeed, processing circuitry may directly transmit amplification parameters to the circuitry associated with the proportional path of the ADPLL to implement bandwidth shifting based on previous signal output of the loop filter in both proportional and integrator paths. The circuitry associated with the proportional path may include a first path, a second path, and a feedback loop. The bandwidth shifting occurs in response to a enable signal, such as a gear trigger control signal (gear_retime signal) or an enable signal generated to cause alignment of the shifting with a clock signal (e.g., enable signal generated from the AND logic gates of FIG. 12). Systems and methods described herein many enable multiple bandwidth changing operations (e.g., gear or bandwidth shifting operations) to occur without compromising the complexity of the system. One bandwidth change may occur with a same footprint and a same amount of circuitry of the ADPLL as one hundred bandwidth changes or more, two hundred bandwidth changes or more, three hundred bandwidth changes or more, or any suitable number of bandwidth changes. These systems and methods enable previously used amplification parameters to be able to be discarded after one subsequent cycle.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A circuit, comprising:
    processing circuitry configured to generate a first amplification parameter and a second amplification parameter; and
    an all-digital phase locked loop comprising a digital loop filter having
        a first set of flip-flops configured to load the first amplification parameter at a first time,
        a first path comprising a first digital multiplier configured to receive the first amplification parameter from the first set of flip-flops,
        a second set of flip-flops configured to load the second amplification parameter at a second time, the second set of flip-flops writing the second amplification parameter over a previously stored indication of the first amplification parameter, and
        a second path with a second digital multiplier configured to receive the second amplification parameter from the second set of flip-flops, the second path coupling an output from the second set of flip-flops to an input of the first set of flip-flops.

2. The circuit of claim 1, wherein the processing circuitry is configured to
    receive an indication of a change in frequency, and
    generate a third amplification parameter based on the indication of the change in frequency, the third amplification parameter different from the first amplification parameter and the second amplification parameter.

3. The circuit of claim 1, wherein the processing circuitry is configured to send an enable signal to each flip-flop of the second set of flip-flops, the second set of flip-flops being configured to load the second amplification parameter based on the enable signal.

4. The circuit of claim 1, wherein the first set of flip-flops is configured to transmit the first amplification parameter to the first digital multiplier based on a first rising edge of a clock signal.

5. The circuit of claim 4, comprising synchronization circuitry coupled to each flip-flop of the second set of flip-flops and to an output of each flip-flop of the first set of flip-flops.

6. The circuit of claim 5, wherein the second set of flip-flops is configured to transmit the second amplification parameter based on the clock signal and an enable signal.

7. The circuit of claim 6, wherein a portion of the synchronization circuitry is configured to couple to a first flip-flop of the second set of flip-flops, the portion of the synchronization circuitry having a third flip-flop and a logic gate configured to send a portion of the enable signal to the first flip-flop of the second set of flip-flops, the logic gate having an inverted input and a non-inverted input, the inverted input being coupled to an output of the third flip-flop, the non-inverted input being coupled to an input of the third flip-flop, the input of the third flip-flop being coupled to the output of the first flip-flop of the second set of flip-flops.

8. The circuit of claim 1, wherein the all-digital phase locked loop comprises a lock detector configured to send a lock signal to the processing circuitry based on the digital loop filter locking after receiving the second amplification parameter from the processing circuitry.

9. The circuit of claim 1, wherein the digital loop filter has an adding path with a first adder and a second adder, the first adder being configured to transmit a difference between the first path and the second path to the second adder, the second adder being configured to add a previous output of the digital loop filter to the difference.

10. The circuit of claim 9, wherein the digital loop filter has a feedback path with a third set of flip-flops configured to receive the previous output from an output of the digital loop filter and transmit the previous output to the second adder in response to an enable signal.

11. The circuit of claim 1, wherein the first set of flip-flops are configured to load the first amplification parameter at least one clock cycle before loading the second amplification parameter.

12. An electronic device, comprising:
    processing circuitry configured to generate a first amplification parameter, a second amplification parameter, and a third amplification parameter;
    a digital loop filter configured to amplify a first input signal based on the first amplification parameter, overwrite the first amplification parameter with the second amplification parameter, amplify a second input signal based on the second amplification parameter and the first amplification parameter, overwrite the second amplification parameter with the third amplification parameter, and amplify a third input signal based on the second amplification parameter and the third amplification parameter; and
    a transceiver configured to communicate with another electronic device based on the second input signal.

13. The electronic device of claim 12, wherein the first amplification parameter is generated before the second amplification parameter.

14. The electronic device of claim 12, wherein the processing circuitry comprises an all-digital phase locked loop (ADPLL), the ADPLL comprising the digital loop filter, the digital loop filter comprising a first set of flip-flops and a second set of flip-flops, the processing circuitry configured to
    send the first amplification parameter to the digital loop filter,
    send a first enable signal to the digital loop filter to cause the first set of flip-flops to store the first amplification parameter,
    determine to shift a bandwidth of the digital loop filter using the second amplification parameter;
    send the second amplification parameter to the digital loop filter to cause the second set of flip-flops to store the first amplification parameter; and
    receive an indication that the ADPLL is locked to a reference signal after sending the second amplification parameter.

15. The electronic device of claim 14, wherein the digital loop filter comprises a first path and a second path, the first path comprising a first digital multiplier configured to receive the first amplification parameter from the first set of flip-flops, and the second path comprising a second digital multiplier configured to receive the second amplification parameter from the second set of flip-flops.

16. A method comprising:
sending, via processing circuitry, a first amplification parameter to a digital loop filter of an all-digital phase locked loop (ADPLL);
sending, via the processing circuitry, a first enable signal to the digital loop filter to cause a first flip-flop to store the first amplification parameter;
sending, via the processing circuitry, a second amplification parameter to the digital loop filter to cause a second flip-flop to store the first amplification parameter;
receiving, at the processing circuitry, an indication that the ADPLL is locked to a reference signal after sending the second amplification parameter; and
sending, via the processing circuitry, a third amplification parameter to the digital loop filter at a first time, the first flip-flop storing the third amplification parameter after the first time, and the second flip-flop storing the second amplification parameter after the first time.

17. The method of claim 16, comprising
causing, via the processing circuitry, a transceiver to communicate using a first bandwidth at a second time, the transceiver comprising the ADPLL and the digital loop filter; and
causing, via the processing circuitry, the transceiver to communicate using a second bandwidth at a third time, the second time corresponding to a time before the first time and after sending the second amplification parameter.

18. The method of claim 16, comprising sending, via the processing circuitry, a second enable signal to the digital loop filter to cause the first flip-flop to store the second amplification parameter over the first amplification parameter.

19. The method of claim 16, comprising
determining, via the processing circuitry, to shift a bandwidth of the digital loop filter using a third amplification parameter; and
sending, via the processing circuitry, the third amplification parameter to the digital loop filter to overwrite the second amplification parameter in the first flip-flop and to shift the second amplification parameter to the second flip-flop.

20. The method of claim 16, wherein the first flip-flop comprises a data input terminal and a clock input terminal, and wherein sending, via the processing circuitry, the first enable signal to the digital loop filter comprises sending, via the processing circuitry, the first enable signal to the data input terminal of the first flip-flop.

* * * * *